United States Patent

Gehring

[11] Patent Number: 5,404,322
[45] Date of Patent: Apr. 4, 1995

[54] DIGITAL FILTER AND METHOD OF DESIGN

[75] Inventor: Mark R. Gehring, Portland, Oreg.

[73] Assignees: Seiko Corp.; Seiko Epson Corp., both of Japan

[21] Appl. No.: 863,313

[22] Filed: Mar. 27, 1992

Related U.S. Application Data

[63] Continuation of Ser. No. 667,353, Mar. 4, 1991, abandoned, which is a continuation of Ser. No. 385,326, Jul. 25, 1989, abandoned.

[51] Int. Cl.⁶ .................................................. G06F 15/31
[52] U.S. Cl. .............................. 364/724.16; 364/724.01
[58] Field of Search ...................... 364/724.16, 724.01

[56] References Cited

U.S. PATENT DOCUMENTS

| | | | |
|---|---|---|---|
| 3,949,206 | 4/1976 | Edwards et al. | 364/724.16 |
| 4,430,721 | 2/1984 | Acampora | 364/724.16 |
| 4,524,423 | 6/1985 | Acampora | 364/724.16 |
| 4,542,475 | 9/1985 | Acampora | 364/724.16 |
| 4,691,293 | 9/1987 | Conboy | 364/724.16 |
| 4,751,739 | 6/1989 | Serikawa et al. | 364/725 |
| 4,766,563 | 8/1988 | Fujimoto | 364/724.16 |
| 4,782,458 | 11/1988 | Bhattacharya et al. | 364/724.16 |
| 4,809,209 | 2/1989 | White | 364/724.16 |
| 4,817,025 | 3/1989 | Asai et al. | 364/724.16 |
| 4,896,285 | 1/1990 | Ishikawa et al. | 364/724.16 |

OTHER PUBLICATIONS

Oppenheim et al., *Digital Signal Processing*, Prentice Hall, 1975 pp. 239–250.
McClellan et al. "A Computing Program for Designing Optimum FIR Linear Phase Digital Filters", IEEE Trans. Audio Electro-Acoust., vol. AU–21, pp. 506–526, Dec. 1973.

*Primary Examiner*—Roy N. Envall, Jr.
*Assistant Examiner*—Chuong D. Ngo
*Attorney, Agent, or Firm*—Elmer Galbi

[57] ABSTRACT

A digital filter is designed by characterizing a desired filter passband in the frequency domain, transforming this representation into the time domain, selecting weighting coefficients at periodically spaced intervals from this transformed function, and weighting the coefficients with a Gaussian windowing function. This function may take the form:

$$e^{-|(2n-N)/A|^P}$$

where:
$A = N(-\ln\epsilon)^{-1/P}$; $\epsilon < 1$
$\epsilon$ = Window value desired at $n=0$ and $n=N$ (reduction ratio);
$N$ = (number of F.I.R. taps)–1; and
$P$ = an arbitrary power.

3 Claims, 3 Drawing Sheets

DIGITAL FILTER AND METHOD OF DESIGN

This application is a continuation of application Ser. No. 667,353, filed Mar. 4, 1991, now abandoned, which is a continuation of application Ser. No. 07/385,326, now abandoned, filed Jul. 25, 1989.

FIELD OF THE INVENTION

The present invention relates to digital filtering, and more particularly relates to an improved filter design method that employs Gaussian windowing functions to optimize filter characteristics, and to filters designed in accordance with the improved method.

BACKGROUND AND SUMMARY OF THE INVENTION

Digital filter design is usually accomplished by a well known procedure wherein the desired frequency response of the filter is transformed into a time domain representation. Sampled values of the time domain function at periodic intervals near the center thereof are used as weighting coefficients in the implementation of the filter.

While filters of virtually any desired characteristics can readily be designed by this technique, practical constraints usually limit the number of filter stages (i.e. coefficients) that can be implemented. This limit, which is related to the granularity with which the time domain representation is sampled to yield filter coefficients, compromises the filter characteristics. Thus, a filter that is designed for out-of-band attenuation of at least 40 dB may have only 30 dB attenuation when implemented with 16 coefficients.

When characterizing a desired filter response in the frequency domain, it is typical to specify a desired passband shape, and a flat stop band at some desired level below the passband. Such a flat stop band, however, cannot be realized without a virtually infinite number of filter elements. When this desired response is transformed into a finite number of filter coefficients, the resulting filter response has a rippled stop band. The ripples often violate certain of the initial design constraints, such as the 40 dB out-of-band attenuation figure in the noted example. Sometimes, however, important design constraints can be met if, instead of trying to realize an ideal filter with a finite number of elements, the designer deliberately selects coefficients that do not correspond to an ideal filter.

While plausible in theory, filter designers do not typically start with various rippled filter responses and work through the math to yield corresponding filter coefficients. Instead, usual practice is to compute the time domain function for an ideal filter and then to perturb this function to alter the frequency domain counterpart. By iteratively perturbing the time domain function and computing the corresponding finite element filter response, a designer can sometimes meet critical design constraints with less coefficients than would normally be required.

The above-referenced perturbation is often accomplished by multiplying the idealized time domain function with a windowing function. The Hamming window function is often used, although the literature notes use of other functions, such as the Kaiser function. See, for example, the text *Digital Signal Processing* by Oppenheim et al, Prentice Hall, 1975, pp. 239–250. Perturbing by windowing has an added advantage of mitigating the discontinuities at the edges of the sampled time domain function, thereby reducing spurious filter responses.

According to the present invention, the time domain function is multiplied by a Gaussian window function. The Gaussian function has been found advantageous in many respects. First and foremost, the inventor has discovered that it unexpectedly and fortuitously yields filter coefficients that permit certain design constraints to be met with less filter coefficients than would otherwise be possible using prior art windows or other filter optimization techniques. Second, the Gaussian window is a variable one, permitting the designer to iterate with different window parameters in an attempt to optimize a desired design. Finally, the Gaussian window is computationally simple to implement, permitting an iterative design to proceed relatively rapidly, in contrast to designs employing other variable window functions, such as the Kaiser function, that are computationally intensive to work with, slowing an iterative design.

These and additional features and advantages of the present invention will be more readily apparent from the following detailed description thereof, which proceeds with reference to the accompanying drawings.

DETAILED DESCRIPTION

In order to show the advantages and advances achieved by the present invention, the following paragraphs detail how a filter would be designed to solve a particular filtering problem using conventional filter design approaches.

Conventional Design Approaches

As noted, conventional filter design typically proceeds by characterizing a desired filter passband in the frequency domain, transforming this representation into the time domain, and selecting weighting coefficients at periodically spaced intervals from this transformed function. The filter is then implemented using a topology similar to that shown in FIG. 1.

Figure 1:
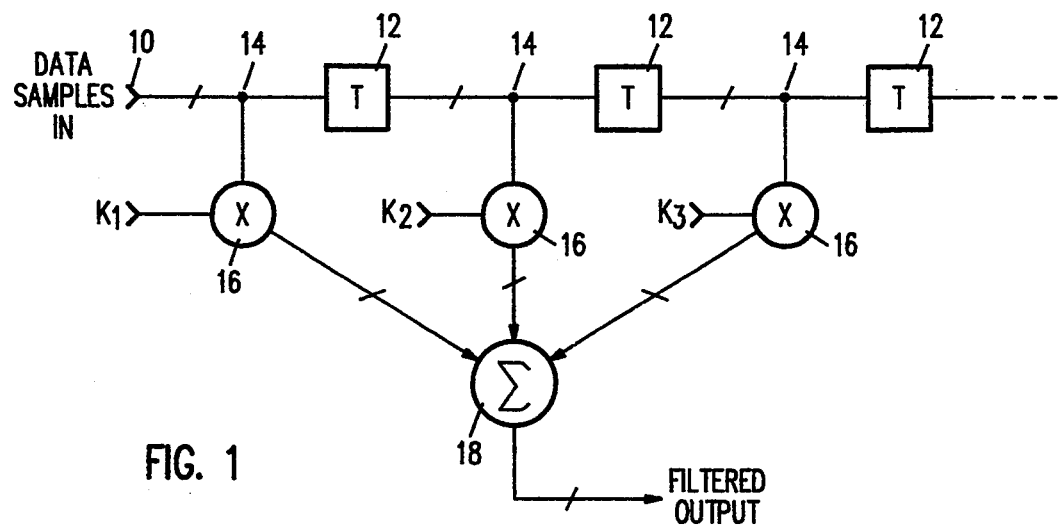
FIG. 1 is a schematic block diagram of a basic finite impulse response filter.

The FIG. 1 filter topology includes a digital signal input 10 and plurality of cascaded delay stages 12 with output taps 14 therebetween. The delay provided by each delay stage 12 corresponds to the spacing interval with which the weighting coefficients were selected from the transformed time function. Delayed signal samples from the different taps are applied to weighting circuits 16 that multiply the samples by the corresponding weighting coefficients. These weighted samples are then summed by a summer 18 to form respective filtered output samples from the filter.

To illustrate the foregoing procedure, assume a filter is required that has a passband centered at 66.5 KHz and a stop band attenuation of at least 40 dB at all frequencies below 53 KHz. (The filter characteristics in a dead band from 53 to 57 KHz are not of concern.) Further assume that the passband is to have a square-root cosine function shape. When this idealized filter response is transformed into the time domain and reduced to a set of 32 8-bit coefficients (a constraint that may be imposed by the particular application), the resulting coefficients are as follows:

| | |
|---|---|
| $K_0$: 0 | $K_{16}$: 4 |
| $K_1$: −8 | $K_{17}$: 10 |
| $K_2$: −11 | $K_{18}$: 8 |
| $K_3$: −1 | $K_{19}$: −9 |
| $K_4$: 23 | $K_{20}$: −40 |
| $K_5$: 58 | $K_{21}$: −78 |
| $K_6$: 95 | $K_{22}$: −110 |
| $K_7$: 121 | $K_{23}$: −127 |
| $K_8$: 127 | $K_{24}$: −121 |
| $K_9$: 110 | $K_{25}$: −95 |
| $K_{10}$: 78 | $K_{26}$: −58 |
| $K_{11}$: 40 | $K_{27}$: −23 |
| $K_{12}$: 9 | $K_{28}$: 1 |
| $K_{13}$: −8 | $K_{29}$: 11 |
| $K_{14}$: −10 | $K_{30}$: 8 |
| $K_{15}$: −4 | $K_{31}$: 0 |

Figure 2:
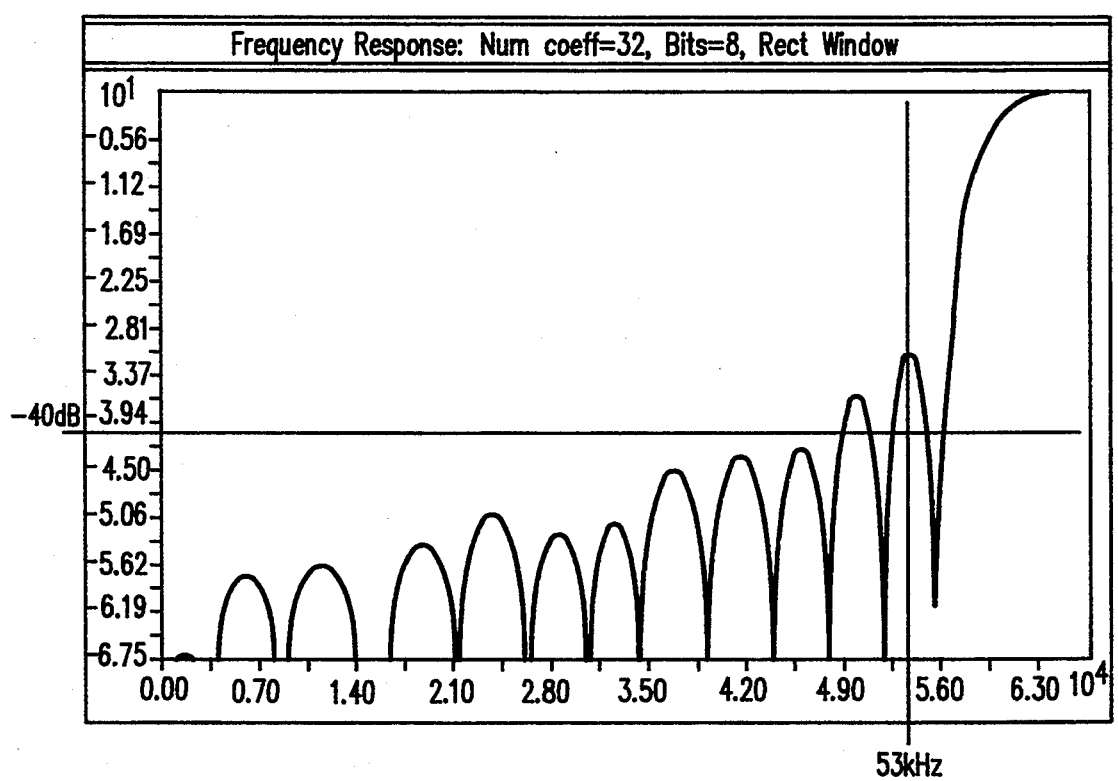
FIG. 2 is a plot showing the frequency response of a basic 32 element filter designed using conventional techniques.

A filter employing these 32 coefficients provides the response illustrated in FIG. 2. As can be seen, the attenuation is only 31 dB at the stop band edge of 53 KHz. The 40 dB stop band attenuation specification is not met until the number of filter stages is increased to 57. Physical constraints may make this number of stages impractical.

In any filter design, it is desirable that the weighting coefficients tend towards zero near the first and last stages in order to avoid spurious leakage of the signal into undesired portions of the spectrum. To effect this shaping, the coefficients themselves are sometimes weighted by a windowing function that peaks near the middle coefficients and diminishes to either side. Weighting by any such window function generally has the effect of suppressing out-of-passband response at the expense of spreading the passband. The Hamming window function is commonly used and takes the form:

$$w(n) = 0.54 - 0.46 \cos(2\pi n/((N-1)), \quad 0 \leq n \leq N-1 \quad (1)$$

If the 32 filter coefficients computed earlier are weighted by this Hamming function, the resulting coefficients are as follows:

| | |
|---|---|
| $K_0$: 0 | $K_{16}$: 0 |
| $K_1$: −1 | $K_{17}$: 2 |
| $K_2$: −2 | $K_{18}$: 2 |
| $K_3$: 0 | $K_{19}$: −4 |
| $K_4$: 13 | $K_{20}$: −26 |
| $K_5$: 44 | $K_{21}$: −64 |
| $K_6$: 85 | $K_{22}$: −104 |
| $K_7$: 119 | $K_{23}$: −127 |
| $K_8$: 127 | $K_{24}$: −119 |
| $K_9$: 104 | $K_{25}$: −85 |
| $K_{10}$: 64 | $K_{26}$: −44 |
| $K_{11}$: 26 | $K_{27}$: −13 |
| $K_{12}$: 4 | $K_{28}$: 0 |
| $K_{13}$: −2 | $K_{29}$: 2 |
| $K_{14}$: −2 | $K_{30}$: 1 |
| $K_{15}$: 0 | $K_{31}$: 0 |

Figure 3:
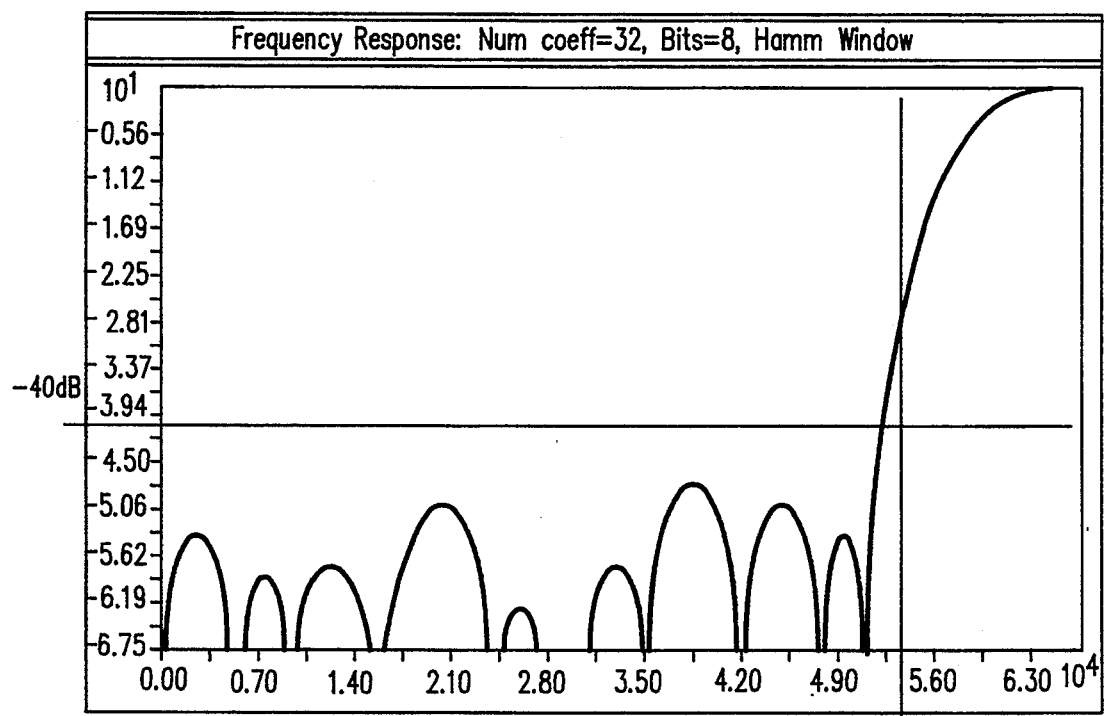
FIG. 3 is a plot showing the frequency response of a 32 element filter designed with a Hamming window.
Figure 4:
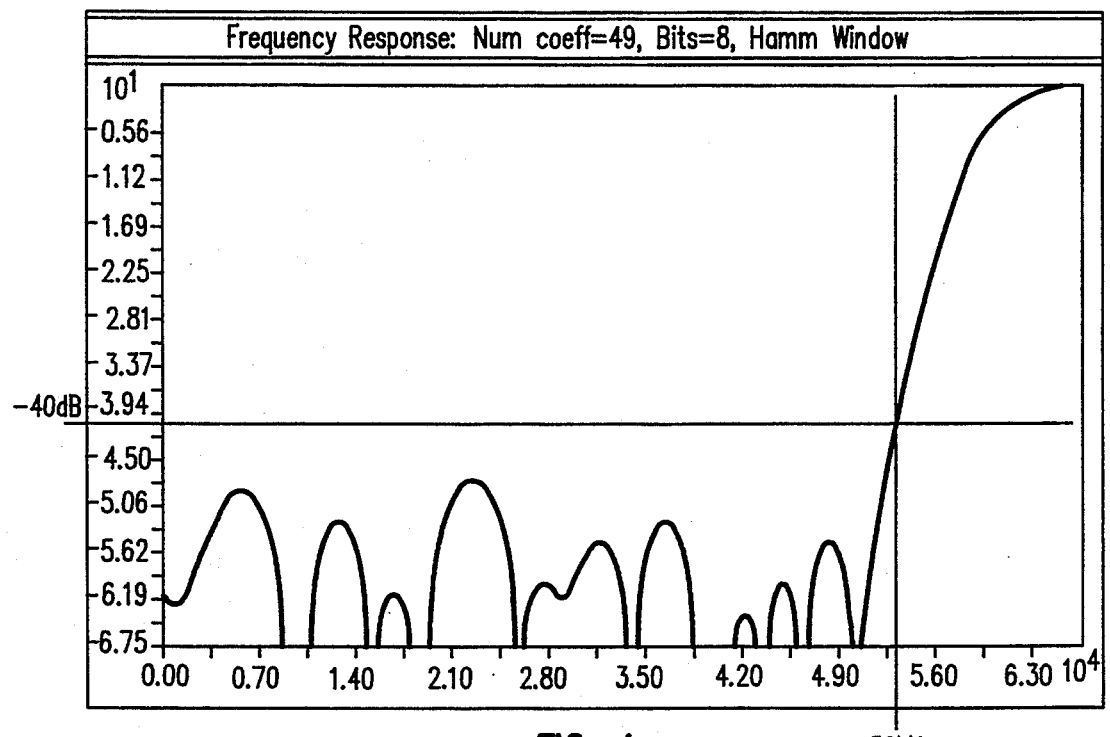
FIG. 4 is a plot showing the frequency response of a 42 element filter designed with a Hamming window.

A filter employing these 32 Hamming weighted coefficients provides the response illustrated in FIG. 3. While an improvement over the basic filter response shown in FIG. 2, this filter still does not provide the required 40 dB stop band attenuation. (As can be seen, the attenuation at 53 KHz is only 30 dB.) This 40 dB stop band specification can be met, however, if the filter is expanded to 42 stages. The frequency response of such a Hamming-weighted 42 element filter is shown in FIG. 4. While 42 coefficients is a substantial improvement over the 57 coefficients required by non-windowed design, this number still may still be impractical to implement in particular circumstances.

From the foregoing results, it appeared that the postulated filter specifications could not be met with a 32 coefficient implementation.

The Present Invention

The inventor made the fortuitous discovery that, by applying a Gaussian window function to the filter coefficients, the filter specifications unexpectedly could be met. The Gaussian function employed in this design can be expressed as:

$$e^{-|(2n-N)/A|^P} \quad (2)$$

where:
$A = N(-\ln\epsilon)^{-1/P}; \epsilon < 1$
$\epsilon$ = Window value desired at n=0 and n=N (reduction ratio); and
N = (number of F.I.R. taps)−1

Unlike most other windowing functions, this Gaussian function is variable, providing different windowing functions by altering the variables P and $\epsilon$. In an iterative procedure, the inventor found that setting P=2 and $\epsilon$=0.47 yields a function that weights the coefficients in such a manner that the filter specifications are met. The Gaussian-weighted coefficients are as follows:

| | |
|---|---|
| $K_0$: −1 | $K_{16}$: 127 |
| $K_1$: 3 | $K_{17}$: −120 |
| $K_2$: −6 | $K_{18}$: 107 |
| $K_3$: 9 | $K_{19}$: −90 |
| $K_4$: −10 | $K_{20}$: 70 |
| $K_5$: 9 | $K_{21}$: −49 |
| $K_6$: −5 | $K_{22}$: 30 |
| $K_7$: −2 | $K_{23}$: −14 |
| $K_8$: 14 | $K_{24}$: 2 |
| $K_9$: −30 | $K_{25}$: 5 |
| $K_{10}$: 49 | $K_{26}$: −9 |
| $K_{11}$: −70 | $K_{27}$: 10 |
| $K_{12}$: 90 | $K_{28}$: −9 |
| $K_{13}$: −107 | $K_{29}$: 6 |
| $K_{14}$: 120 | $K_{30}$: −3 |
| $K_{15}$: −127 | $K_{31}$: 1 |

Figure 5:
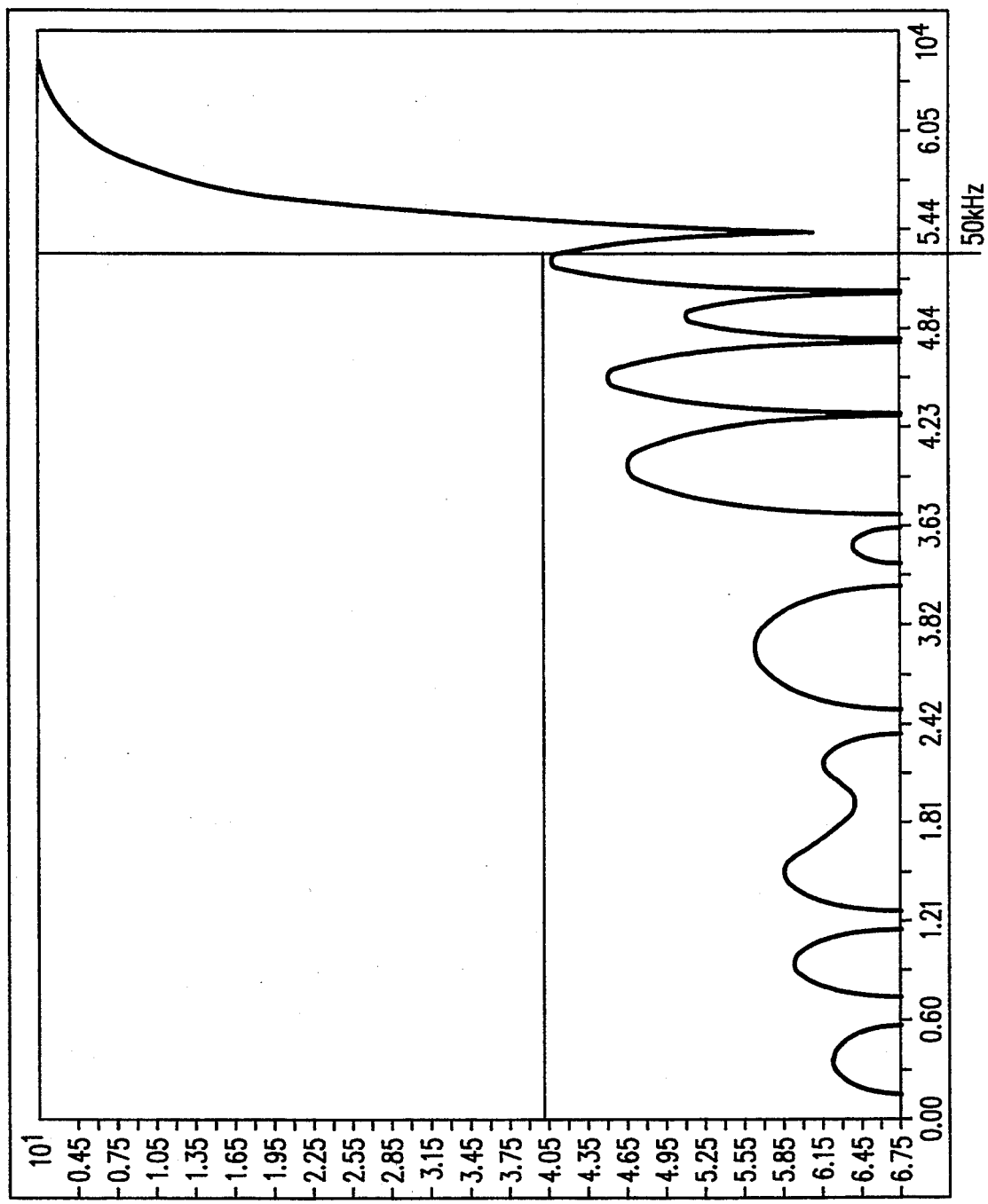
FIG. 5 is a plot showing the frequency response of a 32 element filter designed with a Gaussian window in accordance with the present invention.

A filter employing these 32 Gaussian weighted coefficients provides the response illustrated in FIG. 5. As can be seen, the 40 dB stop band requirement is fulfilled. Furthermore, the passband is advantageously kept relatively narrow. The passband is even more narrow than the Hamming filter shown in FIG. 5, which required 42 coefficients.

The figure of 32 coefficients is itself advantageous since it is a power of two, simplifying implementation. The memory in which the coefficients are stored, for example, typically has a capacity which is a power of two. The coefficients used by the present filter can be stored by a $2^8$ bit memory. A 33 coefficient system, in contrast, would require $2^9$ bits, twice as large. (Due to the symmetry of the coefficients [i.e. $K_0 = -K_{31}$], only half of the coefficients need to be stored. The others can be obtained simply by negating those stored.)

It is believed that the particular values for P and $\epsilon$ used in this example are not optimum in an absolute sense, but are simply desirable for this particular application. In designing another filter, it may be found that other P and ε values, specifying another function from the family of Gaussian functions, will provide advantageous results.

It will be further recognized that this example produced a set of 32 coefficients, yet filters with other numbers of stages could be implemented from this data. To implement a filter with 64 stages, for example, if the sample rate is higher, the above 32 coefficients may be used with 32 other coefficients, such as interpolated values, interspersed.

The above example specified 8 bit coefficients. The underlying mathematics, however, yield floating point numbers of much greater accuracy. The truncation of these floating point numbers to 8 bit integers introduces some irregularities in the resulting filter performance. For example, in a filter implemented with the full floating point coefficients, the filter side lobes diminish relatively uniformly with frequency. In the FIG. 5 plot of the 8 bit Gaussian filter, in contrast, the side lobes are irregular.

Having described the principals of my invention with reference to a preferred methodology and implementation, it will be apparent that the invention can be modified in arrangement and detail without departing from such principles. Accordingly, I claim as my invention all such variations as may come within the scope and spirit of the following claims and equivalents thereto.

I claim:

1. A finite impulse response filter for processing physical digital signals that includes:
   circuit means for generating N successively delayed samples of said digital signal,
   circuit means for weighing said delayed signals with N weighing coefficients $K_0-K_{N-1}$, and
   circuit means for summing the weighted samples to yield a filtered output sample, said N being 32 and said weighing coefficients being scaled as follows:

| | |
|---|---|
| $K_0$: −1 | $K_{16}$: 127 |
| $K_1$: 3 | $K_{17}$: −120 |
| $K_2$: −6 | $K_{18}$: 107 |
| $K_3$: 9 | $K_{19}$: −90 |
| $K_4$: −10 | $K_{20}$: 70 |
| $K_5$: 9 | $K_{21}$: −49 |
| $K_6$: −5 | $K_{22}$: 30 |
| $K_7$: −2 | $K_{23}$: −14 |
| $K_8$: 14 | $K_{24}$: 2 |
| $K_9$: −30 | $K_{25}$: 5 |
| $K_{10}$: 49 | $K_{26}$: −9 |
| $K_{11}$: −70 | $K_{27}$: 10 |
| $K_{12}$: 90 | $K_{28}$: −9 |
| $K_{13}$: −107 | $K_{29}$: 6 |
| $K_{14}$: 120 | $K_{30}$: −3 |
| $K_{15}$: −127 | $K_{31}$: 1, | whereby said filter has at least a 40 dB stop band and a narrow passband.

2. A system for filtering a baseband composite signal to extract a subcarrier signal centered at 66.5 KHz therein, including:
   (a) means for providing a baseband composite signal having a subcarrier signal centered at 66.5 KHz therein,
   (b) sampling means for periodically sampling the baseband composite signal to produce samples,
   (c) digitizing means for digitizing said samples to produce digitized samples,
   (d) storing means for storing said digitized samples for later use,
   (e) weighing means for weighing a particular digitized sample in a particular interval with a coefficient $K_0$, in the first through thirty-first intervals immediately preceding said particular interval with coefficients $K_1$ through $K_{31}$, respectively, said weighing coefficients being scaled as follows:

| | |
|---|---|
| $K_0$: −1 | $K_{16}$: 127 |
| $K_1$: 3 | $K_{17}$: −120 |
| $K_2$: −6 | $K_{18}$: 107 |
| $K_3$: 9 | $K_{19}$: −90 |
| $K_4$: −10 | $K_{20}$: 70 |
| $K_5$: 9 | $K_{21}$: −49 |
| $K_6$: −5 | $K_{22}$: 30 |
| $K_7$: −2 | $K_{23}$: −14 |
| $K_8$: 14 | $K_{24}$: 2 |
| $K_9$: −30 | $K_{25}$: 5 |
| $K_{10}$: 49 | $K_{26}$: −9 |
| $K_{11}$: −70 | $K_{27}$: 10 |
| $K_{12}$: 90 | $K_{28}$: −9 |
| $K_{13}$: −107 | $K_{29}$: 6 |
| $K_{14}$: 120 | $K_{30}$: −3 |
| $K_{15}$: −127 | $K_{31}$: 1, and |

(f) summing means for summing said weighted samples to produce an output signal, whereby said system has at least a 40 dB stop band and a narrow passband.

3. A finite impulse response filter for filtering a digital signal that includes:
   a plurality of delay means for delaying said digital signal producing delayed signals,
   a plurality of means for weighing said delayed signals,
   a summing means for summing said delayed and weighted signals, and
   wherein said filtering coefficients are weighed by a Gaussian windowing function and connected to form a digital filter in accordance with said Gaussian-weighted coefficients, the Gaussian function for each particular tap "n" of the digital filter having the form:

$$e^{-|(2n-N)/A|^P}$$

where:
   $A = N(-\ln \epsilon)^{-1/P}$; $\epsilon < 1$
   $\epsilon$ = Reduction Ratio Window value desired at $n=0$ and $n=N$;
   $N$ = (number of taps) − 1;
   $P = 2$ and $\epsilon = 0.47$;
whereby said filter has at least a 40 dB stop band and a narrow passband.

* * * * *